United States Patent
Acciarri et al.

(10) Patent No.: US 8,961,745 B2
(45) Date of Patent: Feb. 24, 2015

(54) PLANT AND METHOD FOR PRODUCING A SEMICONDUCTOR FILM

(71) Applicant: VOLTASOLAR S.r.l., Turate (IT)

(72) Inventors: Maurizio Filippo Acciarri, Milan (IT); Simona Olga Binetti, Milan (IT); Leonida Miglio, Como (IT); Maurilio Meschia, Asti (IT); Raffaele Moneta, Mozzate (IT); Stefano Marchionna, Arsizio (IT)

(73) Assignee: VOLTASOLAR S.r.l., Turate (Como) (IT)

( * ) Notice: Subject to any disclaimer, the term of this patent is extended or adjusted under 35 U.S.C. 154(b) by 0 days.

(21) Appl. No.: 14/165,914

(22) Filed: Jan. 28, 2014

(65) Prior Publication Data

US 2014/0209452 A1   Jul. 31, 2014

(30) Foreign Application Priority Data

Jan. 29, 2013 (EP) .................................... 13425019

(51) Int. Cl.
*C23C 14/34* (2006.01)
*H01J 37/34* (2006.01)
(Continued)

(52) U.S. Cl.
CPC ........ *H01L 21/6719* (2013.01); *C23C 14/0021* (2013.01); *C23C 14/0623* (2013.01);
(Continued)

(58) Field of Classification Search
USPC ............. 204/192.12, 192.25, 298.09, 298.26, 204/298.24, 298.25; 118/718, 719, 723 VE, 118/727; 427/561, 585, 587, 593, 96.8; 438/102, 603, 604
See application file for complete search history.

(56) References Cited

U.S. PATENT DOCUMENTS 4,798,660 A    1/1989  Ermer et al.
4,866,032 A  * 9/1989  Fujimori et al. .............. 505/476
(Continued)

FOREIGN PATENT DOCUMENTS

IT    TO20 070 648  A1    3/2009

OTHER PUBLICATIONS

M. Acciarri, "Hybrid sputtering/evaporation deposition of Cu(In, Ga)Se2 thin film solar cells", Energy Procedia, Dec. 23, 2011, pp. 138-143, vol. 10.
(Continued)

*Primary Examiner* — Rodney McDonald
(74) *Attorney, Agent, or Firm* — Sughrue Mion, PLLC

(57) ABSTRACT

The plant is suitable to produce a semiconductor film (8) having a desired thickness and consisting substantially of a compound including at least one element for each of the groups 11, 13, and 16 of the periodic classification of elements. The plant comprises an outer case (1) embedding a chamber (2) divided into one deposition zone (2a) and one evaporation zone (2b), which are separated by a screen (3) interrupted by at least one cylindrical transfer member provided with actuation means rotating about its axis (5). To the deposition zone (2a) a magnetron device (7) is associated, for the deposition by sputtering of at least one element for each of the groups 11 and 13 on the side surface (α) of the cylindrical member that is in the deposition zone (2a). To the evaporation zone (2b) a cell (10) for the evaporation of at least one element of the group 16 is associated, and such an evaporation zone (2b) houses a substrate (8a) on which the film (8) is produced. The cylindrical member (4) is provided with heating means of a portion of the side surface thereof that is from time to time in the evaporation zone (2b), so that the elements of the groups 11 and 13 previously deposited on this surface evaporate and deposit on the substrate (8a) together with the at least one element of the group 16 forming the film (8).

8 Claims, 11 Drawing Sheets

Figure 1:
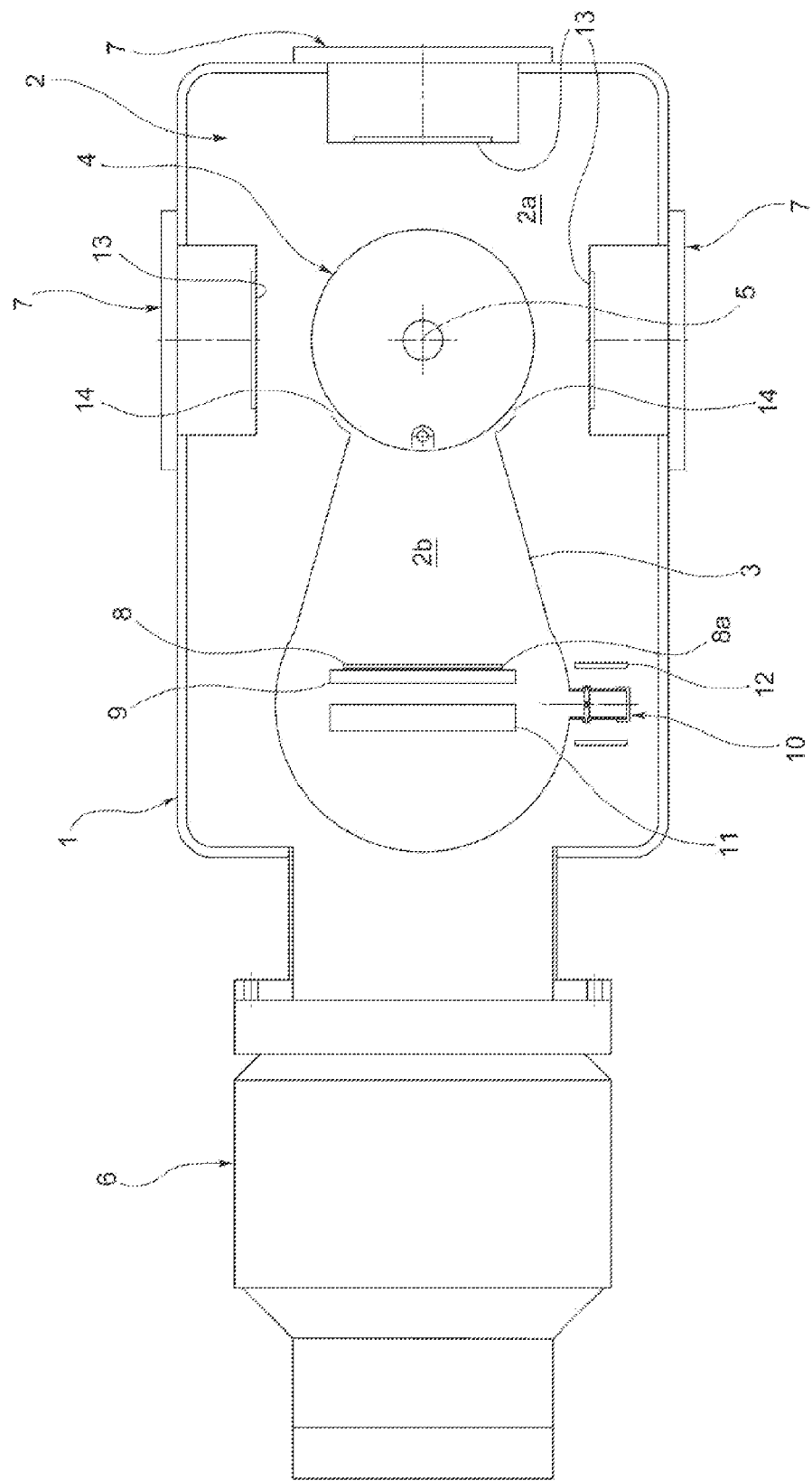

(51) Int. Cl.
  *H01L 21/67*  (2006.01)
  *C23C 14/00*  (2006.01)
  *C23C 14/06*  (2006.01)
  *C23C 14/16*  (2006.01)
  *C23C 14/56*  (2006.01)
  *C23C 14/58*  (2006.01)

(52) U.S. Cl.
  CPC .............. *C23C14/165* (2013.01); *C23C 14/562* (2013.01); *C23C 14/5866* (2013.01); *H01J 37/34* (2013.01); *H01J 37/3429* (2013.01)
  USPC ............ 204/192.25; 204/192.12; 204/298.09; 204/298.24; 204/298.25; 204/298.26; 118/718; 118/719; 118/723 VE; 118/727; 427/561; 427/585; 427/587; 427/593; 427/96.8; 438/102; 438/603; 438/604

(56) References Cited

U.S. PATENT DOCUMENTS

| | | | |
|---|---|---|---|
| 5,439,575 | A | 8/1995 | Thorton et al. |
| 6,974,976 | B2 | 12/2005 | Hollars |
| 7,194,197 | B1 | 3/2007 | Wendt et al. |
| 7,763,150 | B2 * | 7/2010 | Szyszka et al. .......... 204/192.13 |
| 2002/0092766 | A1 * | 7/2002 | Lampkin .................. 204/298.22 |

OTHER PUBLICATIONS

M. Acciarri, "Cu(In, Ga)Se2 hybrid sputtering/evaporation deposition for thin film solar cells application", Photovoltaic Specialists Conference (PVSC), Jun. 3, 2012, pp. 3087-3091.

European Search Report for EP 13 42 5019 dated Jul. 3, 2013.

* cited by examiner

PLANT AND METHOD FOR PRODUCING A SEMICONDUCTOR FILM

The present invention relates to a plant and to the relative method for producing a semiconductor film having a desired thickness and consisting substantially of a compound including at least one component for each of the groups 11, 13, and 16 of the periodic classification of elements.

The most commonly used compounds among those comprising at least one component for each of the groups 11, 13, and 16 of the periodic classification of the elements are: $CuInSe_2$ briefly indicated as CIS, $Cu(In_xGa_{(1-x)})Se_2$ with x ranging between 0.5 and 1 briefly indicated as CIGS, as well as compounds in which a part of the selenium is replaced by sulfur such as, for example, $Cu(In_xGa_{(1-x)})S_ySe_{(1-y)}$ with x ranging between 0.5 and 1 and y ranging between 0 and 0.5. By varying the composition or percentage of some constituents, for example, the Ga/In ratio, it is possible to vary the compound bandgap from 1 eV to 1.68 eV. It is also possible to vary the composition percentage of the constituents belonging to the groups 11 and 13 in the film thickness so as to have a bandgap variable in the thickness in order to absorb photons with different amounts of energy at different depths in the semiconductor film, thus optimizing the performance thereof according to its use, i.e., such an layer absorbing the solar radiation in a photovoltaic cell.

The conversion efficiency of the solar electromagnetic radiation of the film is strongly affected by the compound composition and the structure: it has been verified that, in order to maximize the efficiency, the Ga/(Ga+In) ratio must preferably range between 0.24 and 0.33, particularly 0.28, while the Cu/(Ga+In) ratio must preferably range between 0.8 and 0.95.

Furthermore, in order to maximize the efficiency, it has been verified that the Ga/(Ga+In) ratio must preferably be not constant in the film, but have a saddle trend with a minimum located at about ⅔ of the thickness.

In a per se known method, in a photovoltaic cell, the above-mentioned semiconductor film is deposited on a flexible (stainless steel, flexible glass, titanium, plastic film suitable for high temperatures) or rigid (glass, ceramic) supporting substrate, with the interposition of a thin film (preferably of Mo) acting as the positive electrode.

Other layers to obtain the joint are then applied above the semiconductor film according to the prior art, the negative electrode, as well as optional further auxiliary layers, to improve the performance of the cell and/or the manufacturing yield of the relative production system by reducing wastes. Between the molybdenum film and the substrate, it is known that a plurality of layers can be interposed in order to obtain several useful effects for improving the device performance, such as a barrier effect to the diffusion of elements that are present in the substrate towards the semiconductor film, isolation of the substrate in the case of metal substrates, refraction of the radiation that is not completely absorbed by the semiconductor and which ultimately passes through the semiconductor.

Furthermore, it is known that a small percentage of sodium (0.2%-0.4%) in the film improves the performance thereof. The introduction of sodium may take place by a direct method, by exploiting the diffusion from the substrate in the case of a soda lime glass substrate or in the case of substrates that do not contain sodium by doping the metal film comprising the rear electrode with small percentages of sodium, or by depositing a NaF film on the rear electrode.

Accordingly, it is possible to produce photovoltaic cells having a solar energy conversion efficiency of about 20% for laboratory products, and greater than 12% for industrial scale products.

However, the known manufacturing techniques of the above-mentioned semiconductor films have not been totally satisfactory as regards the output rates and raw-material exploitation, so as to adversely affect the real applicability thereof in industrial scale processes.

The cells produced in laboratory with very high efficiency have been obtained by depositing the absorbing layer by a "co-evaporation" process referred to as the "three stage method" developed by the NREL (National Renewable Energy Laboratory). The first step of this process provides a deposition by evaporation of In, Ga, and Se to obtain a compound having a $(InGa)_2Se_3$ composition with an In atomic percentage in the (InGa) alloy ranging between 65% and 75%; the second step of the process provides the deposition of Cu and Se leading to the formation of a compound with a Cu/(In+Ga) composition ranging between 0.95 and 1.2; finally, the third step provides again the deposition of In, Ga, and Se to obtain a compound $Cu(InGa)Se_2$ and a Cu/(In+Ga) final ratio of less than or equal to 0.92. Throughout the deposition step, the Se flow has to be kept in an excess with respect to the flows of the metals, with a ratio ranging between 4 and 6 times the total flow of the metals.

This is a process that is not very suitable for the industrial production in high volumes, due to the difficulty to properly control the evaporation flows of large evaporation cells.

Over the years, different solutions to simplify the co-evaporation process have been proposed to increase the productivity of the plants to the detriment of the efficiency of the produced cell.

The first simplification was to replace the co-evaporation with a sequential evaporation of the metals of the group 11 and 13 in the presence of selenium. U.S. Pat. No. 7,194,197, for example, discloses a roll-to-roll plant, where the metal precursors and Se are deposited on a continuously moving flexible substrate. The assembly provides a chamber in which a vacuum level is implemented, which is suitable for the evaporation processes with winding roll system for the supporting substrate, and a series of evaporative sources arranged below the substrate and orthogonal thereto; throughout the deposition step, the substrate is kept heated at a temperature of about 500° C./550° C. However, even in this case, as for the co-evaporation, the difficulty remains to obtain large evaporation cells with homogeneous flows, and to control the flow coming out therefrom.

An alternative solution for producing the film is to deposit it by a sputtering process; in this case, it is possible to reach high deposition rates. The solutions proposed for this type of deposition are many, in the U.S. Pat. No. 6,974,976, filed by Miasole, a procedure is described to obtain the CIGS compound completely by a sputtering process by using a series of cathodes having the following compositions: $CuSe_2$, In, Ga, and Se alloys where Ga is introduced as $Ga_2Se_3$, Indium is introduced as metal In, and as $In_2Se_3$ while keeping the (InGa)/Se ratio>1 to have the conductibility of the target. This production method allows depositing the entire absorbing film by sputtering in a neat Ar atmosphere, or optionally in an Ar and $H_2Se$ atmosphere. The drawbacks of this technique are substantially three: efficiency of the cell lower than that of the cell obtained by co-evaporation, complexity of the deposition system, a high cost and difficulty to produce the target with Metal-Se alloys.

In order to solve these difficulties, several methods have been developed, in which the metal precursors (Cu, In, Ga)

are deposited by sputtering of metals or alloys of the metal precursors while Se is inserted to form the compound or by depositing it by evaporation or performing a step that is referred to as selenization, after the metal deposition step.

U.S. Pat. No. 5,439,575, filed by the University of Illinois, discloses a method and apparatus for depositing simultaneously all the components of the absorbing film; the metal precursors are deposited by sputtering; while selenium is deposited by an evaporative source. The substrate on which the CIGS absorbing film has to be deposited is hit by the flow of the metals coming from the sputtering sources, while the selenium flow is produced by an evaporative source and brought to the substrate by a supply duct. The chamber is filled with an inert gas (Ar or Kr) suitable for the sputtering process at the pressure required by the sputtering process (0.1-0.4 Pa). However, this solution does not allow keeping a high excess of the Se flow (4 to 6 times compared to the flow of metals to obtain high efficient cells) due to the Se condensation on the target cold surface and consequent poisoning of the target. The described process, while being a process occurring in a single step, exhibits the limitation to have a low productive efficiency and to produce low efficient films due to the reduced Se flow.

Those processes providing for a selenization step begin with a first deposition step of the precursors, followed by the selenization step, i.e., a step in which a thermal-chemical reaction of the deposited film with the selenium vapors or $H_2Se$ gas occurs.

U.S. Pat. No. 4,798,660, filed by Atlantic Richfield Company, discloses a method in which, on a metal film acting as an electrode, a Cu layer and an In layer are deposited sequentially by DC sputtering, then they are selenized in a Se atmosphere (preferably, in a H2Se atmosphere) to produce a radiation absorbing film with a homogeneous composition corresponding to a $CuInSe_2$.

Selenization with a $H_2Se$ gas, due to the severe toxicity thereof, generates a considerable plant complexity in the case of plants having a high production capacity.

The films obtained by deposition of metals and successive selenization do not reach the efficiencies of the co-evaporation solution.

An object of the present invention is to obviate the drawbacks referred to by the prior art, ensuring a composition-controlled deposition and spatial homogeneity, as well as a flow of compound(s) of the group 16, particularly Se, in a high excess compared to the flows of the metals of the groups 11 and 13.

According to the invention, such an object is achieved by a plant having the characteristics specifically referred to in the claim 1 below.

Preferred embodiments of the plant of the invention are the subject of the dependant claims 2 to 13.

It is a further subject of the present invention a method of producing a semiconductor film that provides to use the above-mentioned plant.

The plant of the invention allows obtaining an indirect deposition of the film from the sputtering devices to the substrate. Particularly, by a series of one or more sputtering devices, the metal precursors of the semiconductor film of the groups 11 and 13 are deposited, under an inert atmosphere free from selenium vapors, on one or more cylindrical transfer members, having the desired atomic ratio, optionally variable during the deposition, by adjusting the currents or power to the sputtering devices.

The sputtering devices are arranged in a first deposition zone at a portion of the surface of a respective transfer member, while the remaining portion of the latter faces a second evaporation zone in front of the substrate on which the semiconductor film is to be deposited. The two zones are physically separated by a screen, which is interrupted by the cylindrical transfer members, having an axis lying substantially in the general plane of the screen.

When the material deposited on the transfer members is—by the action of the rotational movement of the latter—in front of the substrate, it is evaporated by local heating means. The latter ones typically focus a high thermal flow towards the zone in which the evaporation is required. The substrate temperature during the deposition preferably ranges between 250° C. and 600° C., and more particularly between 400° C. and 570° C.

In the first deposition zone, an inert atmosphere is present, advantageously of Ar at a pressure ranging between 0.05 and 5 Pa. The Se flow towards this zone is substantially blocked by the presence of the screen, separated by small passages from the surface of the one or more transfer members. In the second evaporation zone, an atmosphere composed of Ar, atomic Se, and vapors of the metals evaporated from the one or more transfer members is present. Se is provided by an evaporation cell maintained at such a temperature as to ensure a partial pressure in the second zone determining an impingement on the substrate of at least 4 times greater than the flow of the metals coming from the one or more transfer members.

It is preferable to completely evaporate the material present on the transfer member, so that the successive steps in front of the magnetron devices allow a complete control of the composition.

The advantages of the plant and the method of the invention are:
  growth of the film at the same conditions of the co-evaporation method with evaporation cells,
  composition control by the sputtering devices,
  no possibility of Se condensation on the targets or poisoning thereof,
  possibility to use any type of targets, also mono-component targets, this allowing a cost reduction,
  separation of the working environment into two distinct zones, i.e., a first zone in which the deposition on the transfer member of the metals by sputtering devices occurs, and a second evaporation zone in which the transfer of the metals deposited on such a member towards the substrate by evaporation into a partial high pressure Se atmosphere occurs.

Figure 2A:
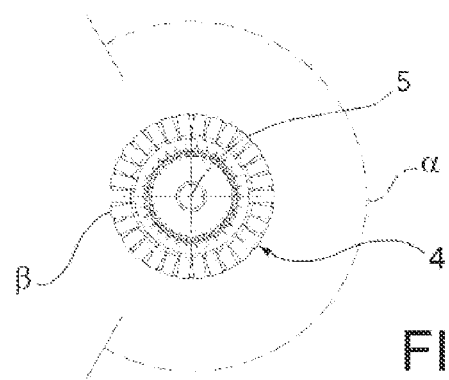
Figure 2:
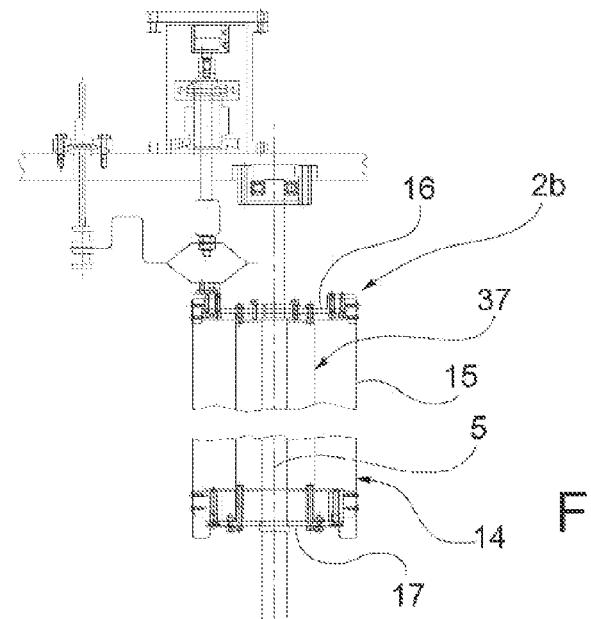
Figure 2A:
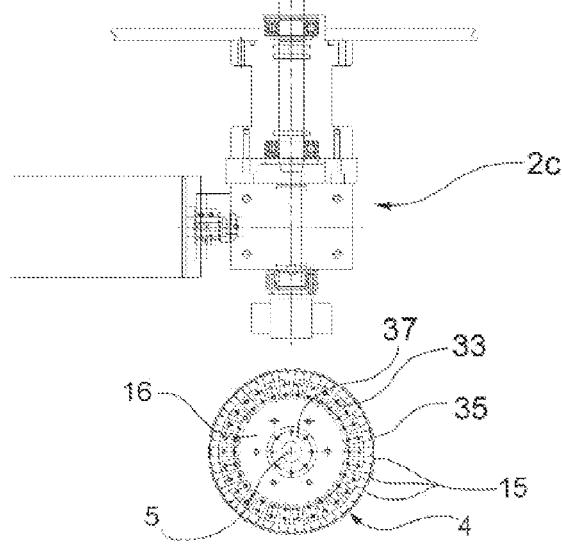
Figure 2B:
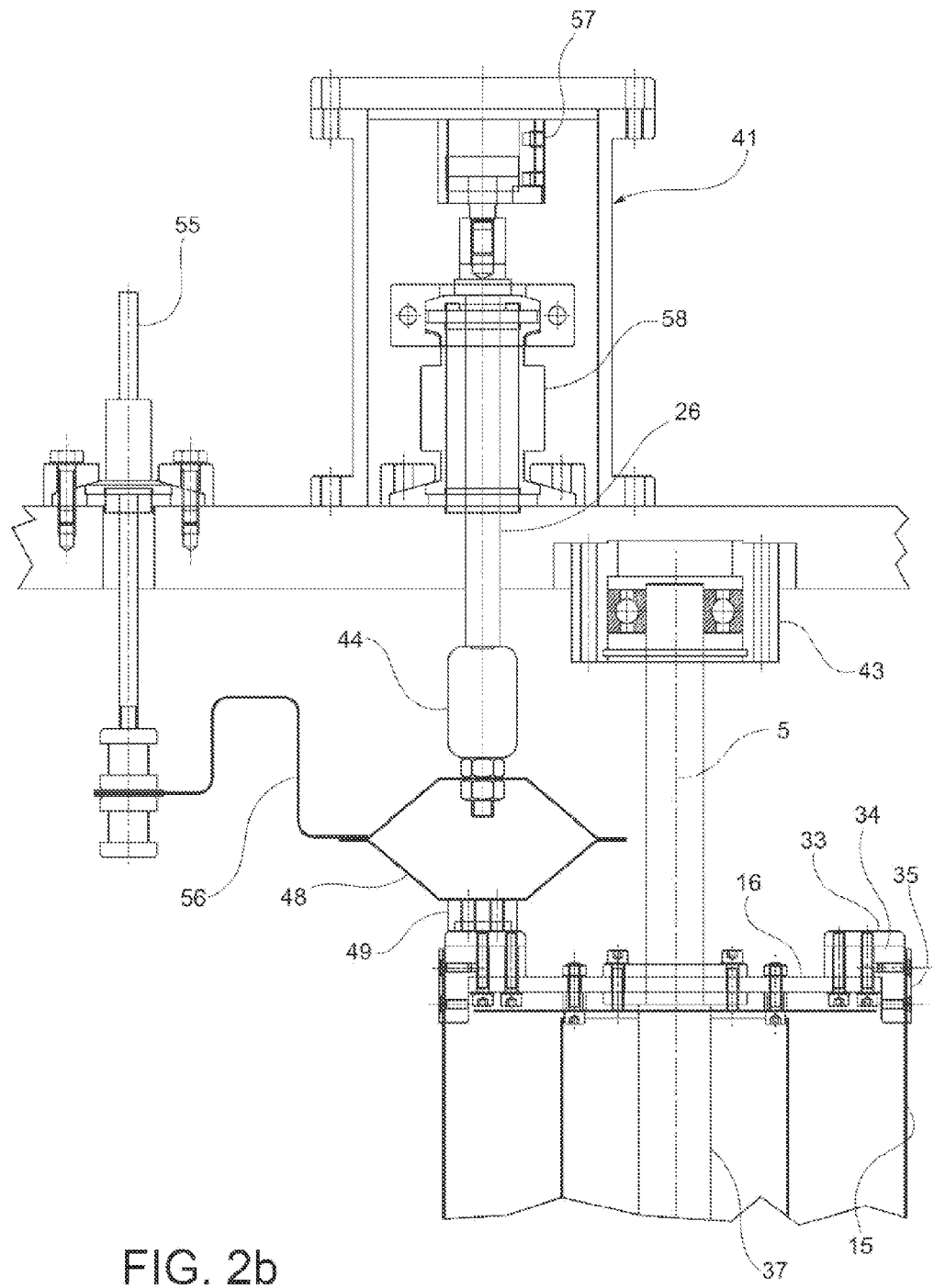
Figure 2C:
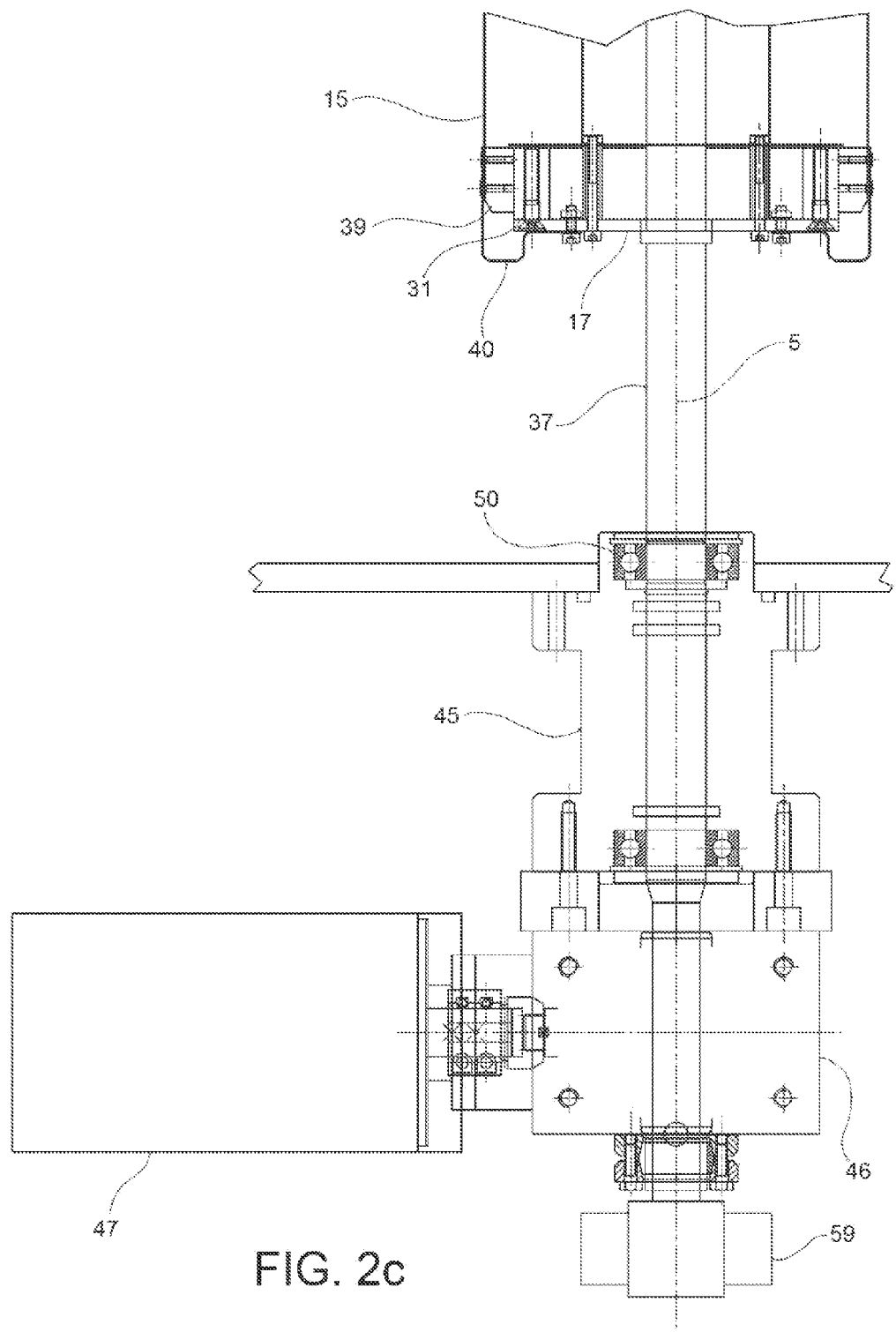
Figure 3:
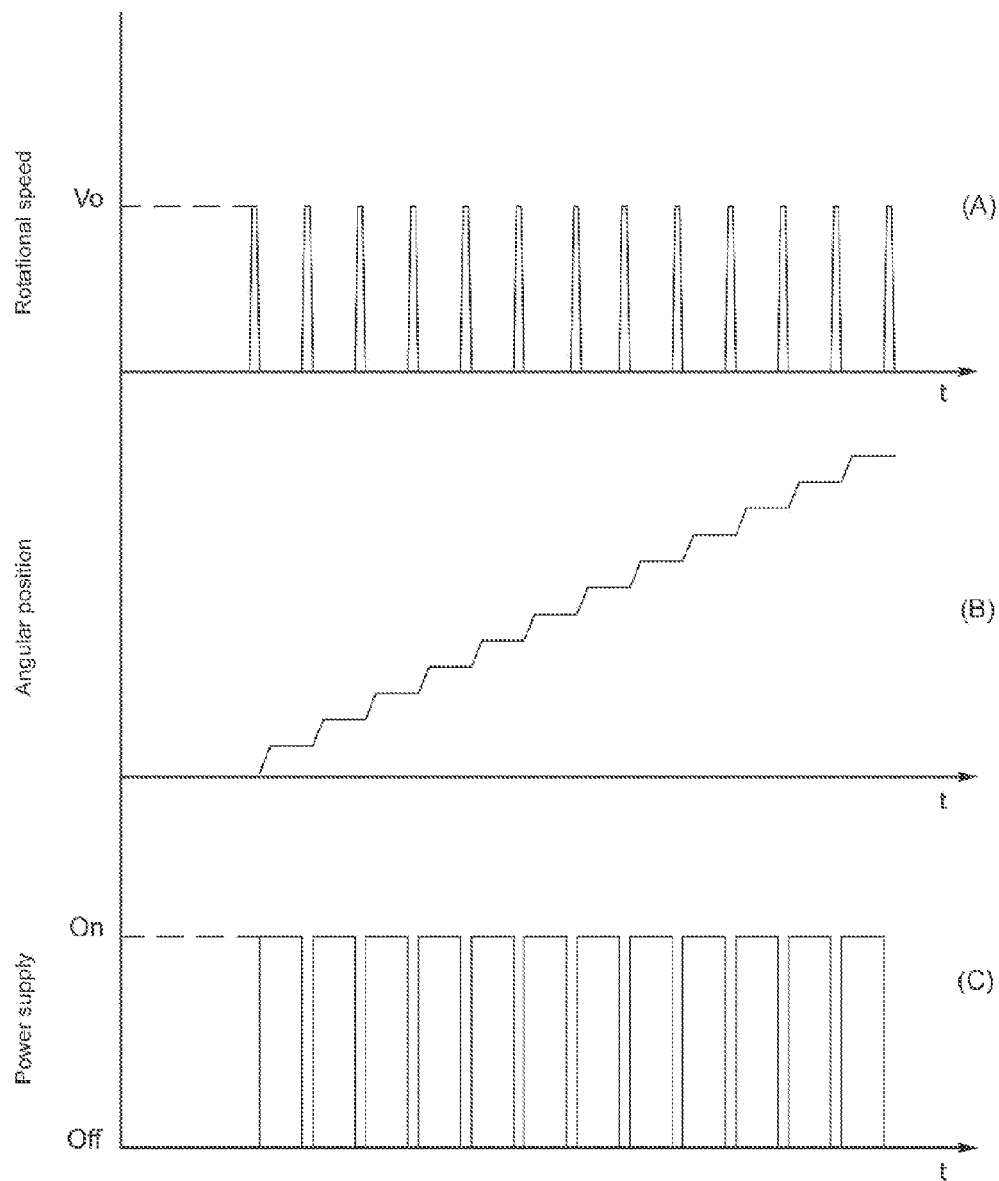
Figure 4:
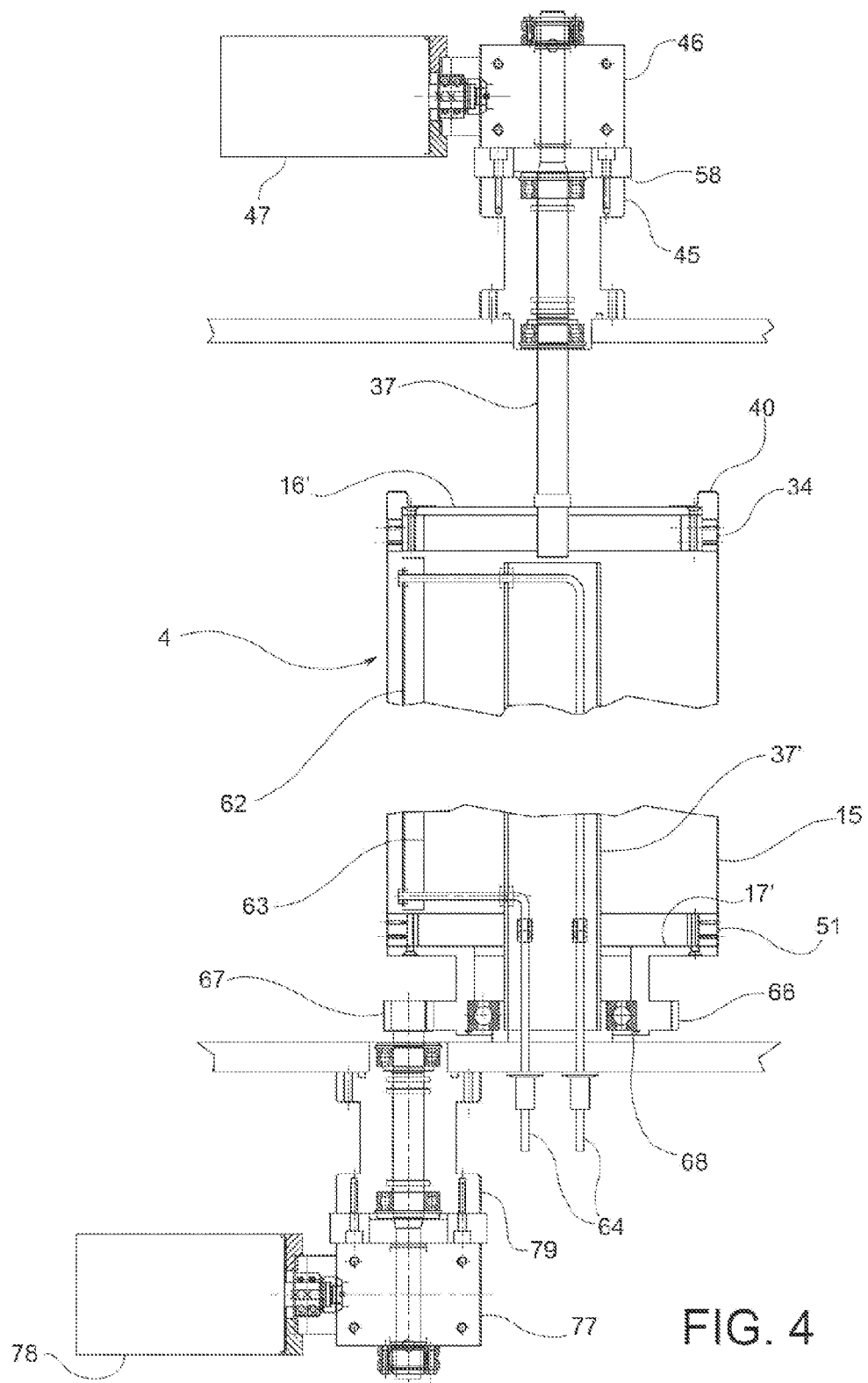
Figure 5:
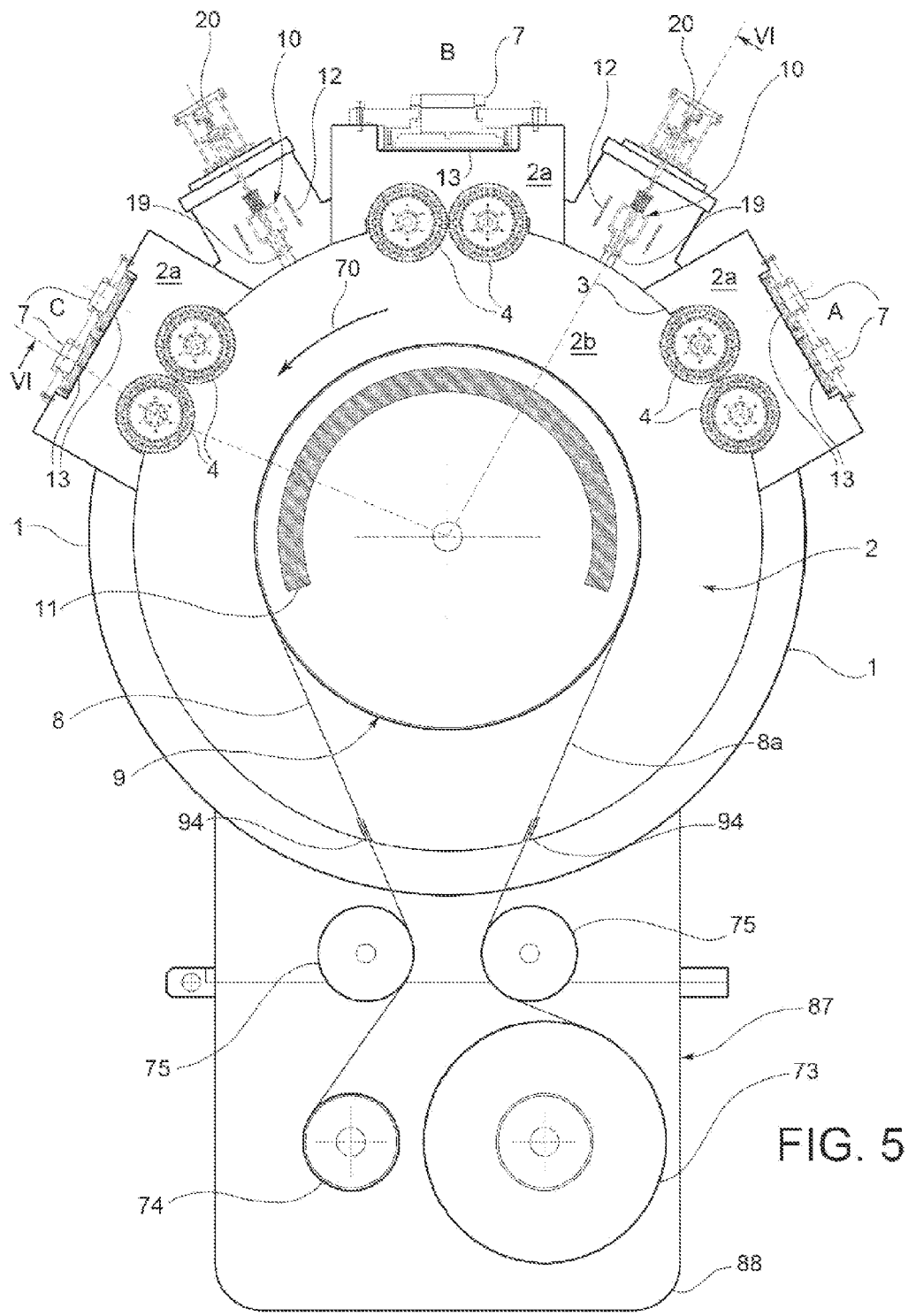
Figure 6:
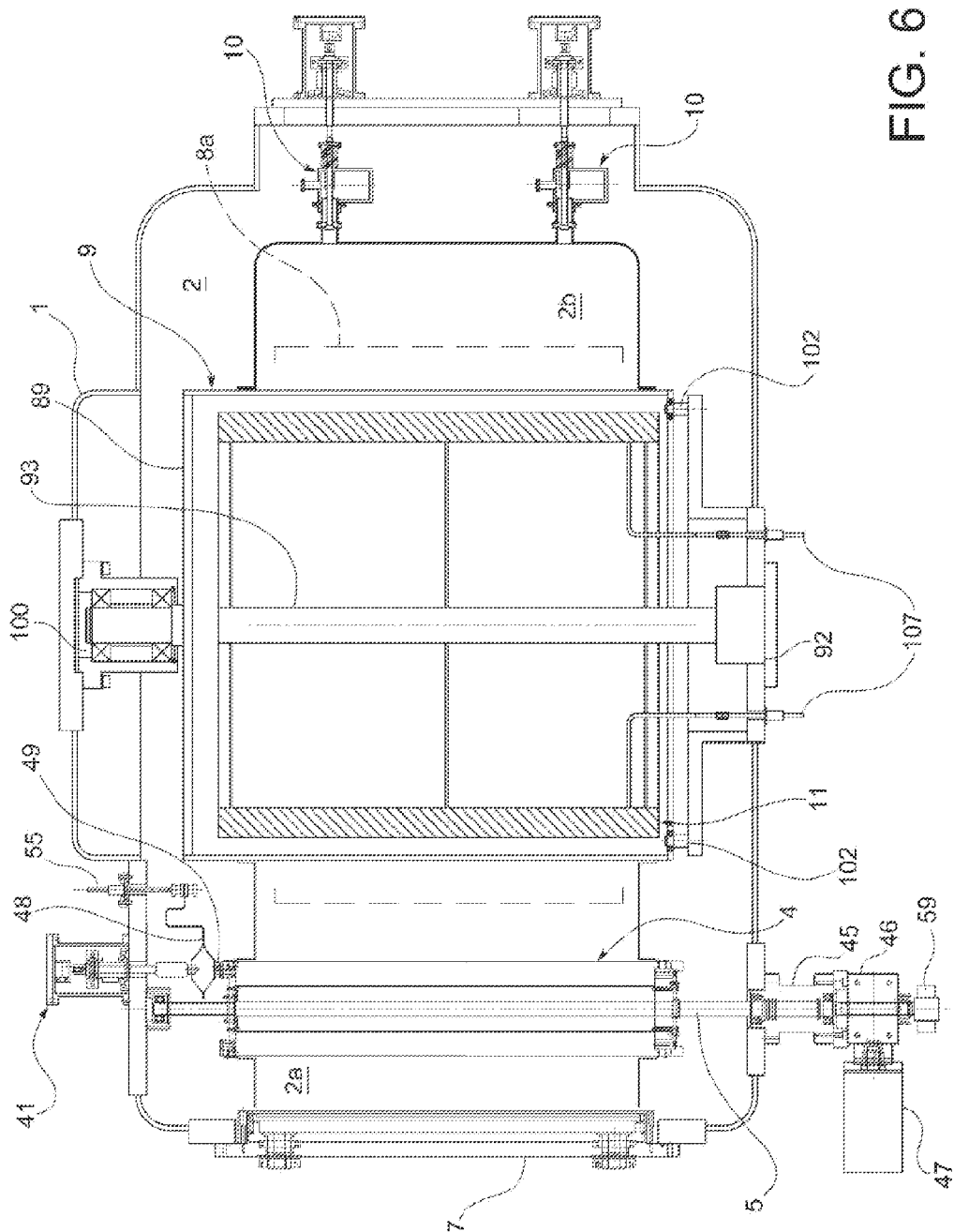
Figure 7:
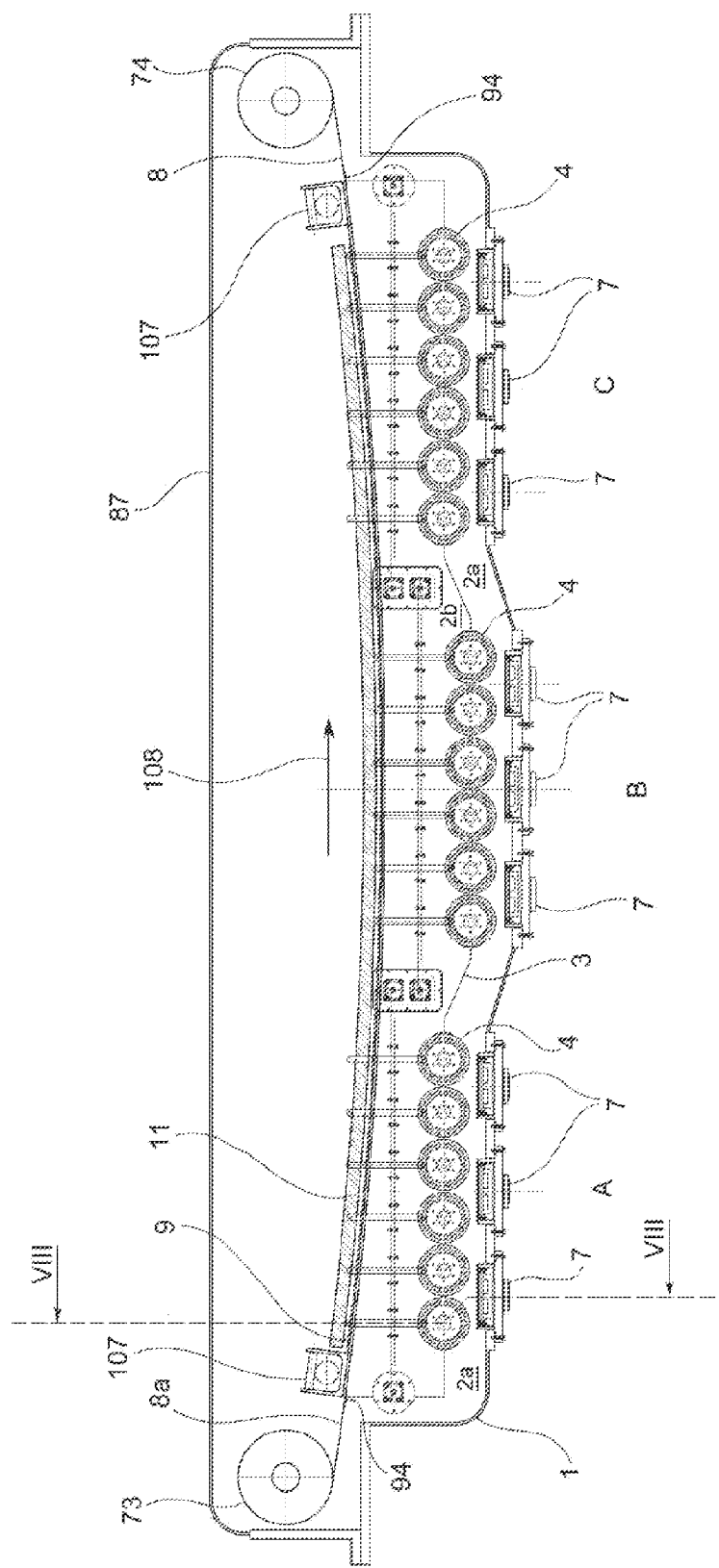
Figure 8:
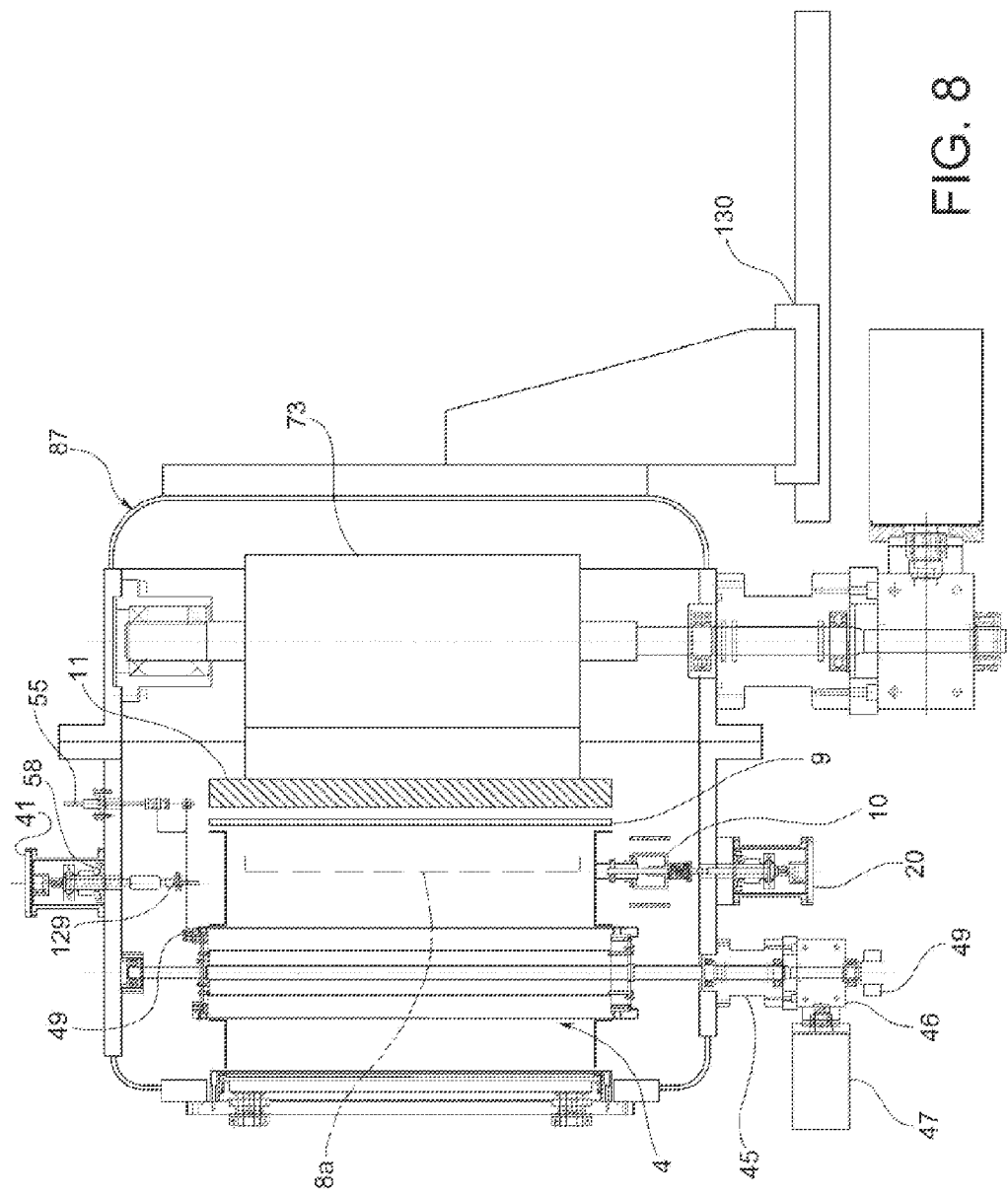
Figure 9:
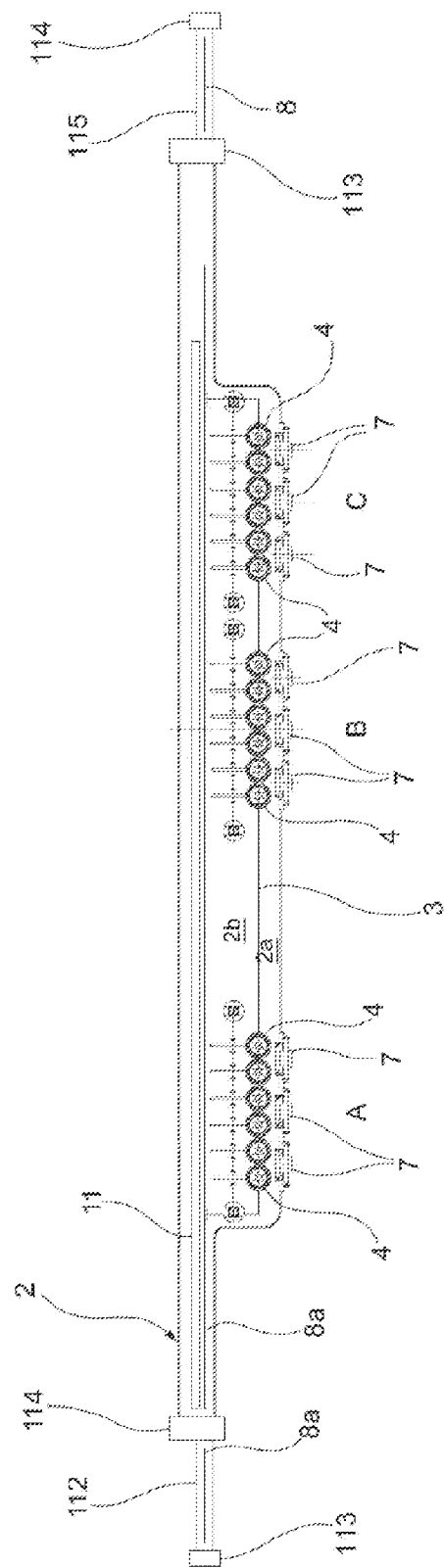

Further advantages and characteristics of the present invention will be apparent from the following detailed description, provided by way of non-limiting example, with reference to the appended drawings, in which:

FIG. 1 is a plant principle scheme according to the invention,

FIG. 2 is an elevational view of a transfer member of the plant of FIG. 1, FIGS. 2a and 2a' are respective plan views of the transfer member of FIG. 2, FIGS. 2b and 2c are views in enlarged scale of respective details of the transfer member of FIG. 2, FIG. 3 is a diagram showing the evolution over time of operational parameters of the transfer member of FIG. 2, FIG. 4 is an elevational view of an alternative embodiment of the transfer member of the plant of the invention, FIG. 5 schematically illustrates a first implementation example of plant according to the invention, FIG. 6 is a sectional view along the line VI-VI of FIG. 5, FIG. 7 schematically illustrates a second implementation example of plant according to the invention, FIG. 8 is a sectional view along the line VIII-VIII of FIG. 7, and FIG. 9 schematically illustrates a third implementation example of plant according to the invention.

A plant (FIG. 1) to implement a method for producing a semiconductor film consisting substantially of a compound containing at least one component of each of the groups 11, 13, and 16 of the periodic classification of elements comprises a case 1 embedding an inner chamber 2 divided into a deposition zone 2a and an evaporation zone 2b, separated by a screen 3 interrupted by a cylindrical transfer member, particularly a drum 4 provided with actuation means for rotation about the central axis 5 thereof. Passages 14 having a width as reduced as possible separate the edges of the screen 3 from the opposite surfaces of the drum 4.

Vacuum pumps 6, and three magnetron devices 7 for sputtering deposition, each being provided with a target 13 of an element of the groups 11 and 13 or of an alloy of two or three elements of the groups 11 and 13, so that at least one element of the group 11 and one element of the group 13 is present, are associated to the zone 2a.

A cell 10 for the evaporation of at least one element of the group 16, particularly Se alone or in combination with S, and the deposition thereof on a substrate 8a on which the film 8 is produced, is associated to the evaporation zone 2b. The cell 10 is provided with a heater 12. In the evaporation zone 2b, the substrate 8a is provided with a support 9 to which heating means 11 are associated.

As it will be described in detail herein below, the drum 4 is provided with heating means of a portion of the side surface thereof being present from time to time in a point in the evaporation zone 2b, so that the elements of the groups 11 and 13 previously deposited on such a surface evaporate and deposit on the substrate 8a together with at least one element of the group 16 forming the film 8.

The drum 4 preferably has the following characteristics:
low thermal inertia (reduced mass per surface unit),
low thermal conductibility in the movement direction,
high dimensional and physical thermal stability at the maximum working temperatures (about 1700-1800° K),
negligible vapor tension at the maximum working temperatures,
very low reactivity with the materials deposited and with Se at the maximum working temperature.

The plant is completed by a series of Ar gas dosing devices, which gas is necessary to the sputtering process, a preferably servo-controlled system for the movement of the transfer device, an electronic control and relative sensors for the control of the temperatures, and particularly for the temperature of the substrate and the evaporation cell, as series of generators to supply the sputtering devices. All of these devices are per se well known to those skilled in the art, therefore a detailed description thereof is not necessary.

The deposition method begins when suitable vacuum conditions have been reached in the zone 2a, typically a pressure of less than 0.01 Pa, as well as with a pre-heating of the substrate 8a and the evaporation cell 10.

Once the required temperatures have been reached, Ar gas is introduced in the inner chamber 2 and the deposition of the metals on the drum 4 begins by adjusting the currents to the magnetron devices 7, so that a composition between the metals representing the one intended to be obtained on the substrate 8a is present on the transfer drum 4. Such a composition may vary during the deposition so as to obtain in the film 8 growing on the substrate 8a a composition gradient. By way of example, in the case that three magnetron devices 7 are used, each being provided with a single-material target (Cu, In, Ga), the three-step procedure described before can be implemented, which requires to deposit in the first step only with the magnetron devices provided with the In and Ga targets, in the second step only with the magnetron devices with Cu target, and in the third step again with magnetron devices with In and Ga targets.

When the material deposited on the rotating drum 4 reaches the evaporation zone 2b, the relative heating means are actuated, so as to evaporate it and to deposit it on the substrate 8a together with Se and the optional S. The deposition process by sputtering of the metal precursors and the successive evaporation thereof continue until the desired thickness and composition of the film are obtained.

Once the deposition has been completed, and after possible annealing step in the presence of Se at the deposition temperature, the cooling step begins, initially up to a temperature of 250-300° C. in the presence of Se, then the cooling continues in vacuum up to room temperature.

FIGS. 2a to 2c illustrate in more detail the structure of the drum 4. The latter has a side surface formed by a plurality of sheets 15 arranged on a circumference parallel to the axis 5 of the drum 4 and with a space between each pair thereof ranging between 0.2 and 1 mm, preferably 0.5 mm. The sheets 15 are of an electrically conductive material with a very low vapor pressure at the working temperatures (max 1700-1800° K) and very low reactivity with the metals deposited and with selenium. Preferably, each lamina 15 has a thickness ranging between 0.05 and 1 mm, a width ranging between 10 and 30 mm, and a length of about 100-150 mm greater than the active length of the magnetron 7 and the substrate 8a on which the film 8 is produced.

The presence of distinct and mutually spaced apart sheets 15 eliminates the lateral thermal conduction. The material of the sheets 15 is preferably graphite in the form of a flexible web (an example of a commercial product is Pemafoil, produced by Toyo Tanso), or, alternatively, metal webs of Tungsten, Molybdenum, Tantalum, Niobium, and alloys thereof, or ceramic webs in silicon carbide can be used.

At the two ends of the side surface of the drum the respective flanges are located: the first flange 16 (FIG. 2B) is of a nonconductive material and resistant to high temperatures such as, for example, quartz, alumina, and any other type of ceramic material, the second flange 17 (FIG. 2C) is made of a conductive material, preferably of Molybdenum, Tungsten, Niobium, Tantalum or alloys thereof.

The first flange 16 bears a series of terminals consisting in a main element 34 resistant to high temperatures and with characteristics similar to those of the sheets 15. The plates 35 urge the sheets 15 against the respective main element 34 of the terminal. A further respective plate 33 implements a head electric contact to the terminal. The terminals are in the same number as the sheets 15 and they are mutually spaced apart so that, even with the thermal dilatations, a minimum resistance between a terminal and the other one of at least 1 kOhm is ensured.

The second conductive flange 17 bears a contact ring 31 on which a plurality of contacts 39 runs, having as their aim to keep the sheets 15 aligned and to ensure the electric contact. Respective springs 40, preferably in Molybdenum or, alternatively, in Tungsten, Niobium, Tantalum or alloys thereof are connected to the contacts 39. The springs 40 have as their aim to energize the sheets 15 and to concur to the electric conduction. Each sheet 15 is provided with a contact 39 and an independent spring 40, so that the elongation of the single sheet 15 when it is heated can be compensated for.

At the center of the drum 4 there is a transmission shaft 37 constrained to the two end flanges 16 and 17 and protected by a screen of molybdenum sheet. The shaft 37 performs the function of supporting the entire drum 4 and of receiving the rotational movement transmitted thereto by a motor 47 through a reducer 46. In non-illustrated, alternative embodiments, it is possible to couple the motor directly to the transmission shaft.

The shaft 37 is supported by two end supports 45, 43 secured to the walls of the chamber 2 or to a structure secured to these walls. The support 45 is provided with vacuum tight devices, so as to allow to drive the shaft 37 from the outside of the chamber 2.

In FIG. 2a', the arch α of the drum 4 useful for the deposition by sputtering and the point β on the center line of the evaporation zone 2b, when the sheet 15 from time to time present therein is heated by Joule effect, thus causing the evaporation of the metals previously deposited thereon, are illustrated.

The rotation of the drum 4 is of a discontinuous type, with a stepper forward movement, each rotational step bringing a sheet 15 to the point β of the evaporation zone 2b.

In FIG. 3, the diagram (A) represents, as a function of the time, the trend of the rotational speed of the drum 4; the diagram (B) represents the angular position of the drum 4; and the diagram (C) represents the current passage in the sheet 15 present at the point β of the evaporation zone. Between a step and the next one, a time sufficient to evaporate the material present on the sheet 15 at the point β of the evaporation zone must elapse.

The heating of the sheet 15 that is at the point β of the evaporation zone 2b occurs by passing a direct electric current through it, or a low voltage alternate current (<70 volt). Such current passage occurs—after that the drum 4 performed each step—by forcing an electric contact 49 against the plate 33 that locks the terminal of the sheet 15 present at the point β of the evaporation zone 2b. The contact 49 is forced against the plate 33 by a pneumatic or electric actuator 41 and by a pusher 26 pushing through an insulator 44 on a spring 48 that has as its aim to compensate for small misalignments while determining a contact force independent from the force of the actuator 41.

The mobile contact 49 is electrically supplied by an electrode 55 and a flexible sheet 56. The current that is passed through the sheet 15, which is at the point β of the evaporation zone 2b, must be such as to generate, by the Joule effect, a heating of the sheet 15 to a temperature sufficient to evaporate completely, for the time in which it continues to be electrically supplied, all the material deposited thereon by the magnetron devices 7. In order to ensure the complete evaporation of the metals deposited and to avoid a build-up of non-evaporated material, it is typically necessary to supply the sheet 15 with a 10%-20% power exceeding the one that would be necessary to obtain a complete evaporation.

The actuator 41 is provided with a double action or single action pneumatic piston with spring return 57 and with a bellow spring 58 such as vacuum feedthroughs and anti-rotational system.

Alternatively, it is possible also to use an electric actuator with electromagnet, with or without permanent magnets.

The current at the other end of the sheet 15 is grounded by a rotating electric manifold with sliding contacts 59 adjusted on the shaft 37. Alternatively, the current could be discharged through the end ring 31, the contacts 39, and the rolling bodies of the bearings 50. However, the first solution is preferred, since it avoids that a current circulates in the rolling bodies of the bearings.

In order to avoid disturbances to the control systems, it is preferred that the power supply to the rotating drum 4 comes from an isolation transformer with one of the terminals connected to the ground or to the rotating electric manifold.

After the time necessary to the evaporation has elapsed, the electric contact 49 is withdrawn, and the drum 4 is rotated by another step, so that the next sheet 15 is at the point β of the evaporation zone 2b.

The deposition step of the magnetron 7 on the useful arch α of the drum 4 is not subjected to interruptions, but it takes place continuously with the parameters required to deposit a preset amount of material and for the time necessary to the deposition.

An alternative embodiment of rotating transfer member is represented in FIG. 4, in which numbers equal to those used in the previous figures indicate like or similar parts.

As before, such a member is a drum 4 the side surface of which is made of sheets 15 arranged in parallel on a circumference and connected, by terminals 34 and traction springs 40 necessary to compensate for the thermal expansion, to a flange 16'. The terminals 34 run on a support ensuring the proper alignment of the sheets 15.

The flange 16' is connected to the shaft 37 actuatable in rotation by a reducer 46 connected to a motor 47. A vacuum feedthrough 45 completes the actuation system.

At the other end of the drum 4, a second flange 17' is arranged, to which the sheets 15 are secured by a terminal element 51. In this case, it is not necessary to isolate each sheet 15, since the heating thereof at the point β of the evaporation zone 2b is caused by a resistor 62 provided with a reflective screen 63 where the heating power is focused on the single sheet 15 that is from time to time present at the point β of the evaporation zone 2b. The resistor 62 is arranged within the drum 4 and it is supplied from the outside, through the hollow shaft 37', by electrodes 64.

In order to allow the passage of the support of the resistor 62 and the supply electrodes 64, the flange 17' has a perforated central insert and, furthermore, having to be put in rotation with the same law of motion as the flange 16' arranged at the other end of the drum 4, it is provided with a guide bearing 68 and with a toothed wheel 66 actuated by a pinion 67. The latter is in turn actuated by a group composed of a reducer 77, a motor 78, and a vacuum feedthrough 79.

Since the sheets 15 are not able to bear any torque, the device geometry is dictated by the synchronism of the movement of the above-mentioned two distinct rotating part, which can be obtained by control algorithms according to a known technique, or by omitting the motor-reducer and using a synchronism shaft.

With this implementation example of the transfer member, the movement is of the continuous type, with a preferably constant speed.

FIGS. 5 and 6, in which number equal to those used in the previous figures indicate like or equivalent parts, illustrate a plant according to the invention of the "roll to roll" type.

Such a plant produces the semiconductor film 8 on a flexible substrate 8a, which, for example, is of one of the following materials: stainless steel (preferably free from nickel), flexible glass (preferably with thickness of less than 0.1 mm and containing sodium), polyimide (Kapton), other plastic materials having similar high-temperature performance, general metals.

The plant comprises a chamber 2 externally cooled by a refrigerated water circuit and provided with a suitable vacuum plant not illustrated in the figure (pumps, transducers, valves for the control of argon gas used in the sputtering process), a central cylinder 9 around which the substrate 8a is wound, on the surface of which the semiconductor film 8, having a desired thickness and consisting substantially of a compound including at least one element for each of the groups 11, 13 and 16, is deposited.

The substrate 8a during the deposition process is unwound from a coil 73 and wound on another coil 74. In order to keep the winding arch constant on the cylinder 9 independently from the diameters of the coils 73 and 74, the substrate 8a passes on two idler rolls 75. The transit speed in the region facing the deposition zone 2a must be kept constant in order to keep the thickness of the deposited film 8a constant. The direction of the movement is, in this configuration, counter-clockwise (see the arrow 70), and the speeds range between 1 and 5 mm/s. Should the functions of the coils 73 and 74 be inverted, the movement would occur clockwise.

Within the cylinder 9, a heater 11 is housed, which is mounted in a fixed position, heating by irradiation the cylinder 9 in the regions facing the deposition zone 2a. In order to achieve the proper temperature profile for the growing film 8, it is possible to divide the heater 11 into zones, each provided with its own power control, so as to have a specific power supplied that varies as the position varies. To detect the temperature of the substrate 8a, it is possible to use sliding thermocouples on the perimeter of the cylinder 9 or infrared temperature sensors.

The coils 73 and 74 are housed in a coil-holder unit 87 having a lid 88 hinged to the case 1 so as to allow access to the coils 73 and 74 for loading and unloading.

The deposition zone 2a is divided into three deposition sub-zones A, B, and C, with the respective magnetrons 7, which are arranged along an arc of circumference and have each two rotating transfer drums 4, of the type described above. The evaporation zone 2b is defined on the opposite side of the drums 4 and the cylinder 9.

In detail, the sub-zone A is provided with two planar magnetrons 7, the sub-zone B with one planar magnetron 7, and the sub-zone C with two planar magnetrons 7. In the case that it is desired to obtain the solution known in the literature as the "three-step method", a magnetron 7 is installed in the zone A with an Indium target 13 and a magnetron 7 with a Gallium target 13 in the desired order; in the zone B, a magnetron 7 is installed with a copper target 13, in the zone C, a magnetron 7 is installed with an Indium target 13, and a magnetron 7 with a Gallium target 13 in the desired order.

Therefore, on a same transfer drum 4, two different metals are deposited in the sub-zones A and C, i.e., Indium and Gallium. Therefore, it is necessary to supply the sheet 15 that is from time to time at the point β of the evaporation zone 2b of each drum 4 with such a power as to allow the evaporation of the metal that is most difficult to evaporate. The deposition zone 2a is separated by the screen 3 from the evaporation zone 2b. The screen 3 is further provided with slots 94 to allow for the passage of the substrate 8a and the substrate 8a on which the film 8 has been deposited. In this method, the containment of selenium coming from the evaporation cells 10 is achieved within the evaporation zone 2b.

The walls of the evaporation zone 2b are heated by the heater 11 of the cylinder 9, so as to avoid the selenium condensation thereon. For large plants, it can be necessary to add heaters outside the evaporation zone 2b, so as to keep its walls at a temperature of about 250-350° C.

The plant can be provided with multiple selenium evaporation cells 10 in dependence on the dimensions of the chamber 2 and the speed of the substrate 8a.

Each cell 10 is provided with a heater 12 and with a thermocouple (not shown in the figures) with which the control system of the plant can adjust the temperature of the cell 10 body. The selenium flow coming out from the cell 10 under conditions of critical regime outflow depends on the passage cross-section and on the pressure of the selenium vapors in equilibrium with the liquid phase within the cell 10. Since the vapor pressure depends on the temperature, by adjusting the latter with a constant passage cross-section, also the selenium flow exiting the cell 10 is adjusted in a deterministic manner. The temperature of the cell 10 must be adjusted so that the selenium flow from the cell 10 towards the evaporation zone 2b is such as to create a partial pressure of selenium vapors determining an impingement rate on the substrate 8a, where the growth of the film 8 occurs, four to twenty times higher than the deposition rate of the atoms of the metals evaporated from the sheets 15 of the drums 4.

Different solutions of cells 10 for Se evaporation are commercially available. The preferred solution provides the use of a cell 10 provided with a valve 19 with pneumatic or electric outer driving means 20. Accordingly, it is possible to pre-heat the cell 10 at the working temperature and open the valve 19 for introducing selenium when the process of deposition begins.

FIG. 6 illustrates in more detail one of the magnetrons 7, one of the transfer drums 4, and evaporation cells 10.

The cylinder 9 is supported by an end flange 89 connected to a central shaft 93 mounted on the case 1 of the chamber 2 by a support provided with bearings 100. The other end of the cylinder 9 is guided by a series of rollers 102 arranged in the proximity of its inner edge and resting on supports that are secured to the case 1.

Accordingly, the cylinder 9 is capable of freely rotating about its central axis due to the motion transmitted by the substrate 8a that is wound on the winding coil 74. In order to ensure the contact between substrate 8a and cylinder 9, a braking torque is applied to the unwinding coil 73 so as to generate an additional traction in the substrate 8a.

The heater 11 of the cylinder 9 is supported by a central support 92 and supplied by electrodes 107.

FIG. 6 further illustrates the actuator 41 for the movement of the electric contact 49 for supplying the sheets 15 of the drum 4, the electric contact 49, the compensation spring 48, the supply electrode 55, the motor 47 for actuating in rotation the drum 4, the reducer 46, the feedthrough 45 with the guide bearings and the sliding contact 59 for the second electric connection.

The deposition plant is completed by the control panel and the microprocessor control system with which the process and operation cycle of the plant is controlled and driven.

In alternative to the planar magnetrons 7, it is possible to use rotating magnetrons or combinations of rotating and planar magnetrons according to the prior art.

FIGS. 7 and 8, in which numbers equal to those used in the previous figures indicate like or equivalent parts, illustrate a plant according to the invention of the linear "roll to roll" type, in which the cylinder support has been replaced by a linear plate support 9 on which the substrate 8a runs.

As in the case above, the deposition zone 2a is divided into three sub-zones to implement the solution in three steps:
 sub-zone A for In and Ga deposition,
 sub-zone B for Cu deposition,
 sub-zone C for In and Ga deposition.

It shall be apparent that plants with a single zone having devices for depositing all the metals or with more than three zones with a combination of metals deposited of any type are equally possible.

The plant comprises a chamber 2 externally cooled by a refrigerated water circuit and provided with a suitable vacuum plant, not shown in the figure (pumps, transducers, valves for the control of argon gas used in the sputtering process), a linear support 9 curved by the end supports 107, so as to ensure the contact with the substrate 8*a* sliding above it, and on the surface of which the semiconductor film 8 is deposited, having a desired thickness and consisting substantially of a compound including at least one element for each of the groups 11, 13, and 16.

During the deposition process, the substrate 8*a* is unwound from the coil 73 and it is wound on the coil 74. The transit speed has to be kept constant in order to keep the thickness of the deposited film 8 constant. The movement direction is from the left to the right (see the arrow 108) and the speed ranges between 1 and 10 mm/s. Should the coils 73 and 74 be inverted, the movement would occur in the opposite direction.

Behind the support 9, a heater 11 is housed, which is divided into multiple sections, each of which being provided with their own power control, which heat the support 9 by irradiation, so as to achieve the proper temperature profile for the growing film 8. To detect the substrate temperature, it is possible to use thermocouples inserted in the support 9 or infrared sensors.

The plant comprises three deposition sub-zones A, B, and C, each provided with six rotating transfer drums 4 of the type previously described.

The evaporation zone 2*b* is defined by the substrate 8*a* and the drums 4. The magnetron devices 7 are arranged facing the opposite side of the drums.

By way of example, the sub-zone A has been provided with three planar magnetrons 7, two with Indium target 13 and one with Gallium target 13, the sub-zone B with three planar magnetrons 7 with copper target 13, and the sub-zone C with three planar magnetrons 7, two with Indium target 13 and one with Gallium target 13. This configuration is suitable for obtaining the solution known in the literature as the "three-step method".

The deposition zone 2*a* with the magnetron 7 is separated by the screen 3 from the evaporation zone 2*b*, in turn, separated from the zone where the winding and unwinding coils 73, 74 are. Slots 94 allow the passage of the substrate 8*a* and the substrate 8*a* on which the film 8 has been deposited. In this way, the containment of the selenium coming from the evaporation cells not shown in this figure is achieved.

The walls of the evaporation zone 2*b* are heated by the emission of the substrate 8*a*: in this way, the selenium condensation thereon is avoided. The plant can be provided with multiple selenium evaporation cells as a function of the dimensions of the chamber and on the speed of the substrate.

In FIG. 8 it can be noticed that the coil-holder unit 87 is mounted horizontally sliding on a guide 130 so as to open and provide access to the coils 73, 74 for loading and unloading. In order to ensure the contact between substrate 8*a* and support 9, a braking torque is applied to the unwinding coil 73, so as to generate an additional traction in the substrate 8*a*.

The support 9 of the substrate 8*a* constitutes one of the walls of the evaporation zone 2*b*, which has as its aim to separate the selenium vapors. The evaporation zone 2*b* is supplied by the evaporation cells 10 provided with a valve driven by the actuator 20.

FIG. 8 further illustrates the actuator 41 for the handling of the electric contact 49 for supplying the sheets 15 of the drum 4, the electric contact 49, the compensation spring 58, and the supply electrode 55.

Unlike the plant of FIGS. 5 and 6, in which each drum 4 is provided with its own actuator, in this case there are two actuators 41 for each deposition sub-zone, which, by isolated rods 129, drive all the contacts 49 of a deposition sub-zone.

In FIG. 8, the motor 47 for handling one of the drums 4, the reducer 46, the feedthrough with the guide bearings 45, and the sliding contact 49 for the second electric connection are further shown.

Since the transfer drums 4 are arranged in line, it is possible to use, instead of a motor for each drum 4, a single motor controlling a group of drums 4, connecting them with a gearing system which transmit the movement one to the other. The gears can be housed on the motor side.

The plant is completed by the control panel and the microprocessor control system with which the process and the operation cycle of the plant is controlled and driven.

FIG. 9, where numbers equal to those used in the previous figures indicate like or equivalent parts, illustrates a plant according to the invention for producing the semiconductor film 8 on a rigid substrate 8*a*.

The latter can be moved by keeping it upright or slightly inclined or, alternatively, horizontally. Except for the supporting and handling systems, the plant solution does not depend on the arrangement of the substrate 8*a*.

The part of plant relating to the magnetron devices 7 to the transfer drums 4, including herein the means for heating and rotation thereof, are derived from the solution used for the "roll to roll" plant previously described. The movement direction of the substrate 8*a* is from the left to the right. Between the first and the second group of magnetrons 7, the chamber 2 has been modified, leaving a gap to have the possibility to bring the substrate 8*a* from a temperature of 300-350° C., that is typical of the first deposition step, to 450-600° C. of the second and third deposition steps. The substrate 8*a* is moved on a linear path in front of the drums 4.

At the inlet end there is a chamber 112 that is provided with isolation valves 113 and 114 and that allows, while keeping the system under vacuum, to load a substrate 8*a*. After bringing the loading chamber 112 under vacuum, the substrate 8*a* is transferred into the main chamber 2, in the position cleared by the previous substrate that is moved, together with all the other ones, at the speed required by the deposition process. Similarly, at the outlet end there is a discharge chamber 115, provided with isolation valves 113 and 114. The chamber 115, after discharging the substrate 8*a* with the film 8, is brought again under vacuum before being reconnected to the chamber 2.

The gap cleared by the substrate 8*a* transferred into the discharge chamber 115 is progressively taken by a new substrate in a cooling step after the deposition of the constituents of the film 8.

The substrate 8*a* that entered the chamber 2 begins the pre-heating step to be brought at the first deposition temperature. The chamber 2 has been extended in this zone to allow a temperature rise with an almost constant rate.

The heater 11 of the substrate 8*a* is divided in multiple sections, each of which being provided with its own power control, to control the temperature rises of the substrate and the temperature in the deposition sub-zones A, B, and C. To detect the temperature of the substrate, it is possible to use infrared sensors.

Once the deposition has been completed, the substrate 8*a* with the film 8 begins a cooling step. The chamber 2 is sized in the zone after the deposition so as to allow the cooling to a temperature of less than 100° C. before the transfer in the discharge chamber 115. The cooling time depends on the thickness of the substrate 8*a* and on the temperature of the walls of the chamber 2 facing the substrate 8*a* with the film 8 being cooled.

It shall be apparent that, while keeping the principle of the invention constant, the implementation details and the embodiments will be able to vary widely compared to what has been described by way of example only, without for this departing from the scope of the invention as defined in the appended claims. Particularly, all of the plant solutions illustrated and described in detail are only indicative, and a number of alternative configurations are possible by varying the number of the deposition zones from 1 to N, and modifying for each zone the number of the magnetrons and/or the number of the transfer members. Particularly, each deposition zone can be provided with a number of transfer members from 1 to M, where N and M may have a value as required. The number of transfer members dictates the deposition speed, and consequently, while keeping the film thickness constant, the transit speed of the substrate in the process zone. The sequence of the magnetrons and the composition thereof dictate the deposition sequence of the metals, thus, the type of solution. Generally, if a three step solution is required, at least three deposition zones are necessary, as those shown in FIG. 5. On the other hand, if a productivity increase, thus, an increase of the transit speed of the substrate are required, it is necessary to increase the number of transfer members for each zone and of the related magnetrons. As the transit speed in the plant increases, the pre-heating and cooling zones will have to be sized consequently. Alternatively to the planar magnetrons, it is possible to use rotating magnetrons or combinations of rotating and planar magnetrons according to the prior art.

What is claimed is:

1. A plant for producing a semiconductor film (8) having a desired thickness and consisting substantially of a compound including at least one element for each of the groups 11, 13, and 16 of the periodic classification of elements, said plant comprising:
   an outer case (1) embedding a chamber (2) divided into at least one deposition zone (2a) and one evaporation zone (2b), which are separated by a screen (3) interrupted by at least one cylindrical transfer member provided with actuation means for rotation about its own axis (5),
   at least one magnetron device (7) being associated to said deposition zone (2a), for the deposition by sputtering of at least one element for each of the groups 11 and 13 on the side surface ($\alpha$) of the at least one cylindrical transfer member that is in the deposition zone (2a),
   at least a cell (10) for the evaporation of at least one element of the group 16 being associated to said evaporation zone (2b), and said evaporation zone (2b) housing a substrate (8a) on which said film (8) is produced, and
   said at least one cylindrical transfer member (4) being provided with heating means of a portion of the side surface thereof that is from time to time in the evaporation zone (2b), so that the elements of the groups 11 and 13 previously deposited on said surface evaporate and deposit on said substrate (8a) together with the at least one element of the group 16 forming said film (8).

2. The plant according to claim 1, wherein said at least one cylindrical transfer member is a drum (4) having a side surface formed by a plurality of sheets (15) of electrically conductive material arranged circumferentially spaced one from the other, a respective spring (40) suitable to compensate the thermal expansion being associated to each sheet (15).

3. The plant according to claim 2, wherein said sheets (15) are mutually spaced apart by a distance ranging between 0.05 and 1 mm.

4. The plant according to claim 2, wherein said heating means of a portion of the side surface of the drum include an electrode (55), an actuator (41) of an electric contact (49), and grounding means causing a current passage through the sheet (15) that, following the rotation of the drum (4), is in a preset position ($\beta$), so that said sheet (15) is heated by the Joule effect.

5. The plant according to claim 2, wherein said heating means of a portion of the side surface of the drum (4) include an electric resistor (62) that is mounted within the drum (4) and to which a reflective screen (63) is associated, focusing the thermal radiation emitted by the resistor (62) on the sheet (15) that, following the rotation of the drum (4), is in a preset position ($\beta$).

6. A method for producing a semiconductor film having a desired thickness and consisting substantially of a compound including at least one element for each of the groups 11, 13, and 16 of the periodic classification of elements, which method provides for using a plant comprising:
   an outer case (1) embedding a chamber (2) divided into at least one deposition zone (2a) and one evaporation zone (2b), which are separated by a screen (3) interrupted by at least one cylindrical transfer member provided with actuation means for rotation about its own axis (5),
   at least one magnetron device (7) being associated to said deposition zone (2a), for the deposition by sputtering of at least one element for each of the groups 11 and 13 on the side surface ($\alpha$) of the at least one cylindrical transfer member that is in the deposition zone (2a),
   at least a cell (10) for the evaporation of at least one element of the group 16 being associated to said evaporation zone (2b), and said evaporation zone (2b) housing a substrate (8a) on which said film (8) is produced, and
   said at least one cylindrical transfer member (4) being provided with heating means of a portion of the side surface thereof that is from time to time in the evaporation zone (2b), so that the elements of the groups 11 and 13 previously deposited on said surface evaporate and deposit on said substrate (8a) together with the at least one element of the group 16 forming said film (8).

7. The method according to claim 6, wherein said semiconductor film (8) is substantially formed by a Cu compound as an element of the group 11, In as an element of the group 13, Se as an element of the group 16.

8. The method according to claim 6, wherein said semiconductor film (8) is substantially formed by a Cu compound as an element of the group 11, In and Ga as elements of the group 13, Se and S as elements of the group 16.

* * * * *